United States Patent [19]

Mizzi

[11] Patent Number: 4,545,023

[45] Date of Patent: Oct. 1, 1985

[54] HAND-HELD COMPUTER

[75] Inventor: Pierre M. A. Mizzi, Paris, France

[73] Assignee: Engineering Project Development Limited, London, England

[21] Appl. No.: 649,963

[22] Filed: Sep. 13, 1984

Related U.S. Application Data

[63] Continuation of Ser. No. 320,312, Nov. 10, 1981, abandoned.

[30] Foreign Application Priority Data

Nov. 14, 1980 [FR] France ............................... 80 24306

[51] Int. Cl.[4] ................................. G02F 1/13
[52] U.S. Cl. ..................................... 364/709; 364/700
[58] Field of Search ... 364/200 MS File, 900 MS File, 364/705, 709

[56] References Cited

U.S. PATENT DOCUMENTS 3,971,013  7/1976  Challoner et al. .................. 340/712
4,025,903  5/1977  Kaufman et al. .................... 364/200
4,060,848  11/1977  Hyatt .................................. 364/200
4,224,615  9/1980  Penz .................................... 340/712
4,274,093  6/1981  Judge .................................. 340/712

Primary Examiner—Gareth D. Shaw
Assistant Examiner—Tim A. Wiens
Attorney, Agent, or Firm—Lewis H. Eslinger

[57] ABSTRACT

The invention relates to a hand-held computer comprising a peripheral frame which contains all the connections and in which cards are removably plugged. A flat display, mounted on said frame, is topped by a transparent plate which forms a matrix of touch-sensitive areas or points. The matrix is also mounted on the frame. The screen and the plate occupy the maximum of the upper surface of the casing and are electrically connected to the other circuits of the computer by contact with the frame on which they are mounted. The computer may be provided with phoneme recognition means, with hand-writing recognition means or with TV or radio receiving means by insertion of appropriate cards.

5 Claims, 4 Drawing Figures

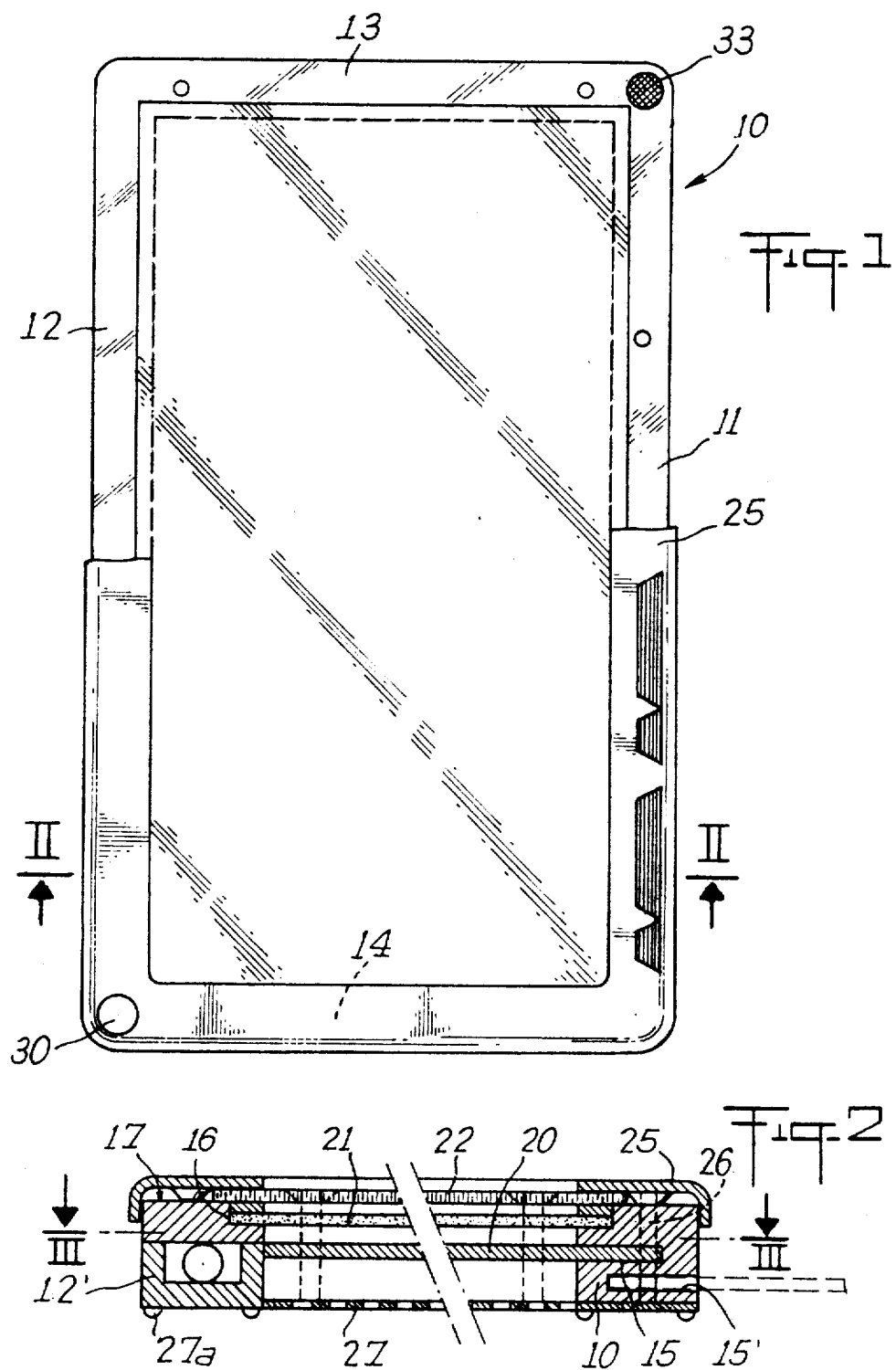

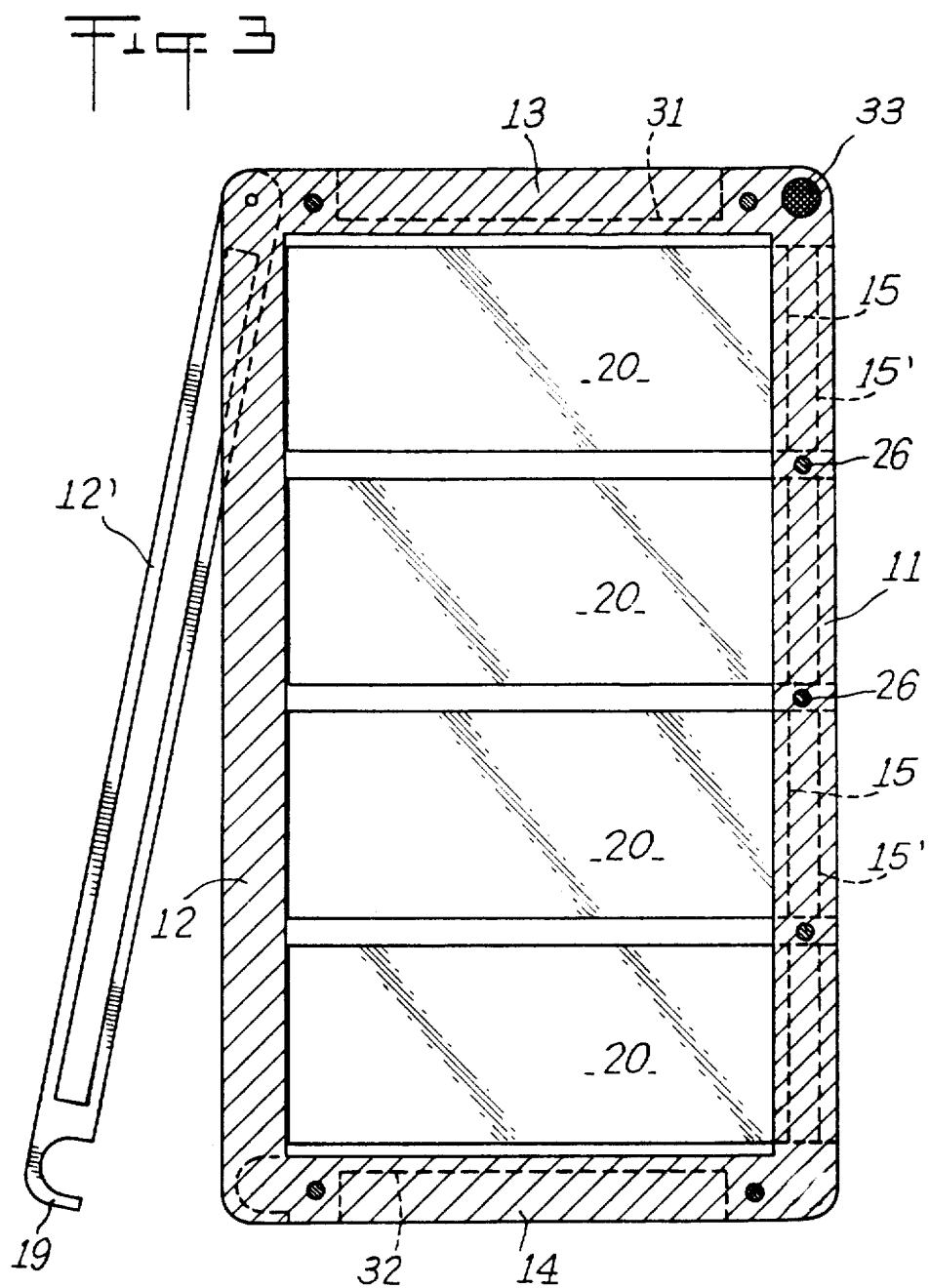

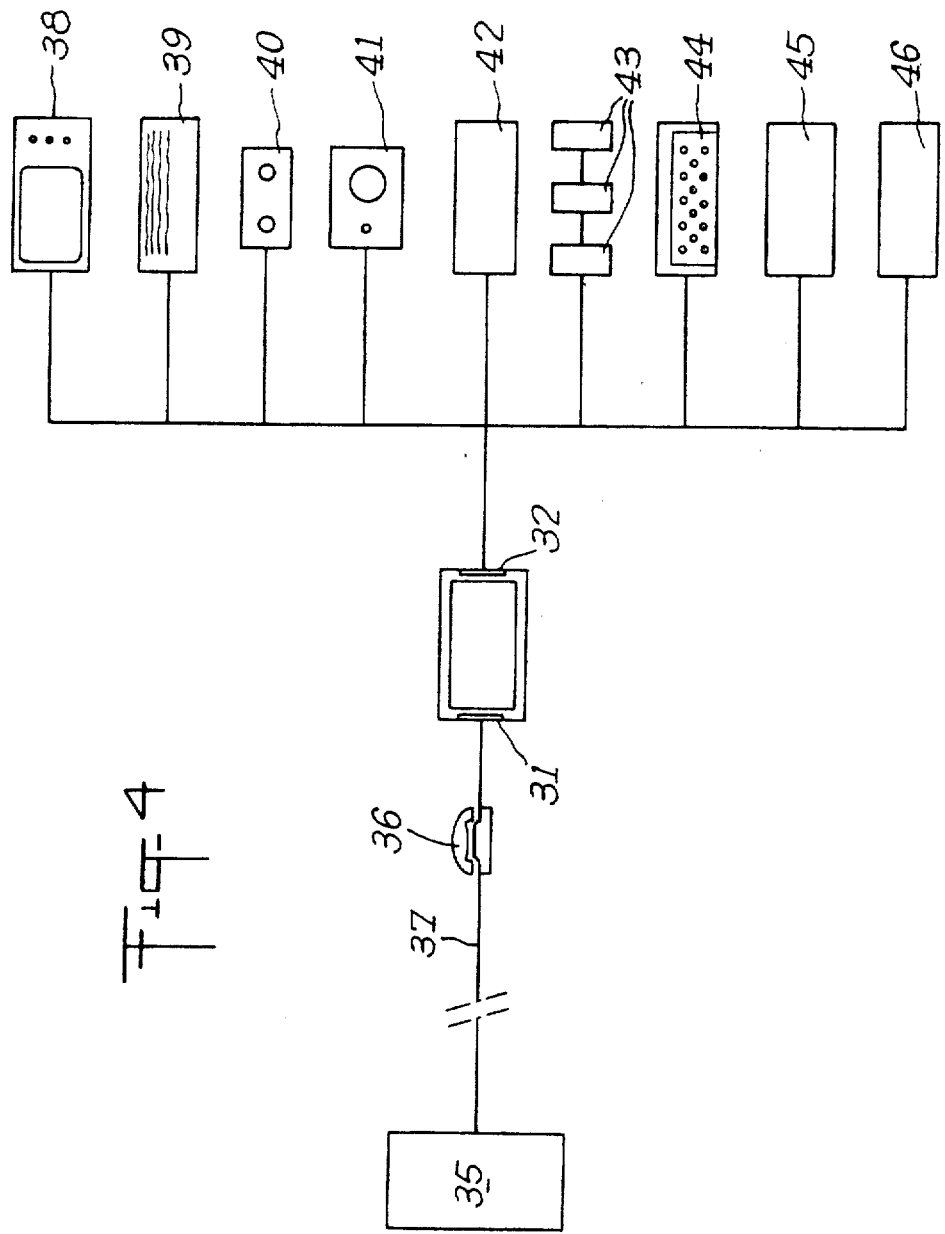

HAND-HELD COMPUTER

This is a continuation of application Ser. No. 320,312, filed 11/10/81, now abandoned.

The present invention relates to a hand-held computer of the type comprising a casing, electronical cards plugged in the casing, a flat display screen on the upper face of the casing, and connections comprising bus lines and one or more connectors.

Hand-held computers (H.H.C.) are already known, which work on batteries and have the size of a pocketbook.

These computers offer the same programming possibilities and possibilities of connection with peripheral modules as the existing micro-computers or "personal computers", with added advantages due to their manoeuvrability and autonomy.

The object of the invention is to propose an all-purpose hand-held computer which is simple to use, easy to maintain and to produce, and which has a wide-surface display screen.

This object is reached with a hand-held computer of the type defined hereinabove, wherein, according to the invention, the casing of the computer comprises a peripheral frame containing all the connections and in which the said cards are removably plugged and wherein the flat screen is mounted on the frame and is covered with a transparent plate including a matrix of touch sensitive points or areas, which plate is also mounted on the frame, said screen and plate occupying the maximum of the upper face of the casing and being electrically-connected to the outer circuits of the computer by contact with the frame on which they are mounted.

The flat screen offers a maximum display surface. It extends virtually over the entire upper face of the casing. The screen is of the matrix type, with liquid crystals for example. It can be activated either point by point in "graphic" programming mode, or by points matrix, according to "character" programming method.

The transparent plate, in glass for example, contains over its entire surface, a matrix of touch-sensitive areas. The outlines of these areas are definable by programming as well as the drawing up and forms of the characters displayed on the screen opposite and below the areas of the transparent plate. Thus, a "hand-operated keyboard" is obtained which comprises only one mechanical key: the ON-OFF key, all the other keys being defined entirely by programming by the user.

Advantageously, the hand-held computer according to the invention comprises a phoneme-recognition circuit and a microphone. The owner of the computer thus has the possibility of creating a "vocal keyboard" by recording, for each zone of the "hand-operated keyboard", a phoneme of its choice. The subsequent recognition of these phonemes by the computer produces the same effect as the touch on the corresponding areas of the manual keyboard.

As far as the keyboards are concerned, it is possible for the following to be entirely programmed by the user:

the position and outline of the touch-sensitive areas,
the (programmed) action initiated by the activation of each area,
the graphic display of the meaning of these areas, for example character outline, or type fonts for different languages, wordings of optional lines proposed in menu form, etc.
phonemes of which the recognition by the hand-held computer will have the same effect as the touch on these areas.
recognition of hand-writing on the matrix of touch-sensitive areas by means of an object having a rounded tip or even by means of a finger.

The hand-held computer according to the invention is rendered inviolable by providing several levels of secret permitting to protect the data and to render the apparatus absolutely impossible to use without the consent of its owner.

According to a special feature of the hand-held computer according to the invention, the electrical connections between the frame and, respectively the screen and the transparent plate are obtained by pressing the edges of the screen and of the plate on respective contact surfaces on the frame. This is done for example by means of press screws.

According to another special feature, one of the sides of the frame comprises an arm, movable with respect to the other sides, to give access, in the open position, to the cards plugged in the frame. Said movable arm, which can be a pivoting arm for example, comprises no bus or connectors. However, this arm is advantageously hollow and contains rechargeable accumulators which are accessible when the arm is in the open position. Said accumulators form an intermediate source for microbatteries provided on a supply card plugged in the casing.

According to yet another special feature, the casing is provided on its lower face with a grid allowing ventilation and transmission of sounds produced by a micro-transmitter mounted on one of the cards plugged in the casing.

What is finally obtained therefore is a hand-held computer of a very simple structure:

a peripheral frame with three sides containing all the electrical connections and the connectors (this avoiding the presence of printed circuits), the fourth side comprising a hollow pivoting arm which can receive rechargeable accumulators;
a transparent top plate forming a protective glass for the screen and including a matrix of touch-sensitive areas;
a flat screen permitting the display of texts, graphs and manual keyboards;
electronic cards which can be plugged inside and outside the frame and bearing for example: the feed and the micro-transmitter, the integrated circuits of a central processor and of its peripherals, RAM and ROM memories, junction interfaces for the external peripheral members;
a lower grid for ventilation and sounds transmission;
clamping means by press screws;
an ON/OFF switch, the mechanical movement of which can be used to operate an electrical "pump", for example with piezoelectric effect capable of temporarily recharging the accumulators; and
a microphone-receiver.

The invention will be more readily understood on reading the following description with reference to the accompanying drawings in which:

FIG. 1 is a diagrammatical view of an embodiment of a hand-held computer according to the invention;
FIG. 2 is a cross-section along the plane II—II of FIG. 1, on an enlarged scale;

FIG. 3 is a cross-section along the plane III—III of FIG. 2 showing the frame of the computer of FIG. 1 and of the cards plugged in said frame; and, FIG. 4 shows various connection possibilities for the computer according to the invention.

The illustrated hand-held computer has a rectangular-shaped frame 10. The dimensions of said frame are for example, length: 18 cm—width: 10 cm—thickness: about 1 cm.

Inside said frame, cards 20 are plugged in connectors 15 provided in one (11) of the larger sides of the frame. A display screen 21 with liquid crystals is mounted on a shoulder 16 of the frame 10, above the cards 20. A transparent plate 22 forming matrix of touch-sensitive areas, in glass for example, is placed against the upper face 17 of the frame 10. A frame-shaped cover 25 rests on the edges of the plate 22 and on the external upper edges of the frame 10. The cover 25 is held in position by means of screws 26 which go through the sides of the frame and rest against a protection grid 27 applied against the lower face of the frame 10 (FIG. 2).

The large side 12 of the frame 10 opposite that in which the connectors 15 are provided, has its upper part, which includes the shoulder 16, integral with the sides 13 and 14. As to the lower part of the side 12, this forms an arm 12' pivoting at one of its ends, on the adjacent side 13 of the frame 10. The other end of the arm 12' (FIG. 3) is shaped as a hook 19 which hooks on to one end of the side 14 to enclose an ON/OFF switch 30. The opening of the arm 12' gives access to the inside of the frame 10 to remove or replace the cards 20. The arm 12' is preferably hollow, for example with a U-shaped cross-section. Rechargeable accumulators can be housed in said arm 12' and are accessible when said arm is in the open position.

The frame 10 contains the computer connections, namely, on the one hand, the connectors for the cards 20, the contact zones for the screen 21 and for the plate 22, connectors for connecting up external systems and if necessary extra cards and, on the other hand, the conductors or bus lines connecting up said connectors with the contact zones.

The contact zone for the screen 21 is formed on that part of the shoulder 16 which is borne by the sides 11, 12, 13 and 14.

In the same way, the contact zone for the plate 22 is formed on the upper face of the sides 11, 12, 13 and 14.

A connector 31 is housed in the side 13, on the external side of the frame 10. Said connector 31 is for example a connector for standardized "series interface" of the type RS 232 (CCITT V 24).

Another connector 32 is housed in the side 14, on the outside of the frame 10. Said connector 32 is for example a standardized connector of the I.E.E.E. type (GPIB) for "parallel interface" (8 bits).

Connectors 15' similar to connectors 15 are provided in the side 11, on the outside thereof, to receive, if necessary, extra cards plugged in on the outside of the frame 10. It will be noted that the connectors 15 and 15' are on different horizontal levels, this allowing them to be relatively deep (See FIG. 2). Reference marks are made on the cover 25, along the side 11, and at the level of the connectors 15' in order to help the plugging in of extra cards into the connectors 15'. As shown in FIG. 1, said reference marks show the position of the guiding means provided for allowing said cards to be inserted only in the right position.

The conductors constituting the data bus, the control bus and the address bus are embedded in the sides 11, 12, 13 and 14 of the frame 10. These four sides, as well as the pivoting arm 12' can be in molded plastics. It will be noted that the pivoting arm 12' contains no connector or bus line, but that it can contain rechargeable accumulators.

The internal removable cards 20 are advantageously of the "hybrid" type, i.e. comprising several chips of integrated circuits embedded in a plastic material, and superficial contacts formed along one edge of the card and on each side thereof. The plugging in of each card and its electrical connection are obtained by inserting the front edge which is provided with the surface contacts, into a connector 15. As shown in FIG. 2, the card is held in position by contact of its rear edge, the arm 12' being in the closed position. The technique used to produce the cards 20 is for example similar to that used to produce the debit cards made available by the banks to private individuals for making payments up to a predetermined limit. This of course does not exclude the possibility of using other types of cards with integrated circuits.

By way of indication, there are four internal cards 20 which have circuits enabling them to have the following functions:

feed and micro-transmitter: on this card are the micro-batteries and the feed circuits as well as the sound transmitting circuits.
 central processor and its peripheral units (inputs-outputs, quick computation, . . . ).
 a central RAM (Random Access Memory) and ROMs (Read Only Memories).
 interfaces: on this card are the interface circuits between the internal cards and the external connectors.

As shown in FIG. 3, spaces are left between the internal cards for letting in air and for the propagation of the sound produced by the microtransmitter. The passage of air and the sound transmission are done through the grid 27. Said grid shows small external protrusions 27a forming a stand when the computer rests on a plane surface.

The display screen 21 is a liquid crystal screen with matrix of points, such as for example that commercialized under the designation "DOT MATRIX" by the Japanese firm EPSON (reference MA-B965B Alphanumeric LCD MODULE).

The screen 21 is provided with superficial contact points along at least two of its four edges in contact with the contact area of the shoulder 16. The pressure needed for the electrical contacts is obtained by means of screws 26 and transmitted to the edges of the screen 21 by the cover 25, the transparent plate 22 and a cross-piece 29 located between plate 22 and screen 21. The cross-piece 29 is shaped like a frame and overhangs the shoulder 16 on all the sides of the frame 10. Said cross-piece 29 can be made from an elastic material.

The display on the screen 21 is controlled by the central processor according to the program in process. The displayed data can be alphanumeric or graphic. It will be noted that the entire surface of the screen 21 inscribed inside the frame 10 is visible and available for data display. The hand-held computer according to the invention is therefore provided with a screen which occupies virtually all its upper surface (see FIG. 1). Thus a maximum display surface is available permitting to dispense with a peripheral screen (C.R.T) in many applications.

The transparent plate 22 is for example a glass plate of the type commercialized under the designation "TOUCH PANEL" E 270 by the U.S. company ELOGRAPHICS Inc. Also available in the system commercialized under the designation "TRANS FLEX" by the U.S. company SIERRACIN CORP., this system being used in the computer "FLUKE 1720" proposed by the U.S. company FLUKE.

The plate 22 is provided with superficial contacts along at least two of its four edges in contact with the contact area of the upper face 17 of the frame 11. The pressure needed to make the electrical contacts is obtained by way of screws 26 and transmitted to the cover 25.

The plate 22 can be compared to a matrix of touch-sensitive areas. Any area touched by the user is identified by its coordinates.

Certain areas have pre-defined allocations which can be modified by coding. They correspond for example to the control "keys" most commonly used in a text editor and are situated on the periphery of the plate 22. The function associated with each one of these areas is symbolized by a sign, a letter or a digit printed on the cover 25, opposite the corresponding zone.

Other areas have an allocation defined by coding. It is thus possible to constitute a keyboard by software using the screen 21 and the plate 22. To this effect, the display of a keyboard is controlled with its normal keys on the screen 21. For each "key", the program defines: the outline of a position, i.e. the touch-sensitive area, on the plate 22 above the screen 21 to actuate the key; the wording inside this area, i.e. the meaning of the key; and the operation or operations to accomplish when the key is "actuated", for example the reading of a code ASCII. It will be noted that the production of a keyboard by software enables to rapidly obtain keyboards with characters of any type of languages, and keys worded in uncoded form.

The possibility of obtaining a keyboard by software with as simple a structure as that of the hand-held computer is a particularly interesting feature. It has the added advantage of leaving only one mechanical key, which is the ON/OFF key 30 situated in the angle formed by the sides 12 and 14 of the frame 10. It is possible to use the mechanical movement of this key to operate an electrical pump (with for example a piezoelectrical effect) to temporarily recharge the emergency accumulators provided in the arm 12'.

It is to be noted here that the invention does not lie in the realization of a "soft keyboard" i.e. a keyboard generated by software, this being already known by itself. The invention consists in a particular structural combination of elements each having a function or even a structure known per se and cooperating with each other to provide a simple all-purpose hand-held computer.

Advantageously, the keyboard may be only used as a complement to a phoneme-recognition system. To this effect, the computer is provided with a microphone 33, which is housed in the angle formed by the sides 13 and 11 and coupled to a recognition card for sound inputs. If necessary, said card is plugged in one of the connectors 15' provided on the outer edge of the side 11 of the frame 10. It will be noted that it represents a sound input validated for only one interlocutor and limited to phonemes, i.e. excluding vocal ideograms implicating a recognition of semantics. Recognition cards of 32 or 64 phonemes are commercialized by the U.S. company HEURISTICS for use with personal computers known under the designation "APPLE". Another system is known under the designation "TRS 80 VOX BOX" and is used by the U.S. company TANDY CORP.

The use of a phoneme-recognition card enables to use the keyboard as an auxiliary measure when the need arises (error of recognition) and also offers the possibility of coding certain signs to avoid any unauthorized use.

The present invention resides in the combination of the different electrical elements constituting the computer (cards, connectors, screen touch-sensitive plate) with a frame forming the mechanical support and ensuring the electrical connections for these elements, the result being a hand-held computer of very simple construction with the largest possible display screen.

Although the invention does not reside in a special use or application of the hand-held computer, different possible uses of it are given hereafter. Specific programs for each of these uses may be found in the known art and do not form part of the claimed invention.

Several possibilities of external connection of the hand-held computer described hereinabove are illustrated in FIG. 4.

In the case of remote processing, the hand-held computer may be connected to a "host" computer 35 via the series interface connector 31, acoustic coupler 36 and a telecommunication line 37.

Various instrumentation connections can be effected, simultaneously if necessary, by connecting the parallel interface connector 32 with a video screen 38, a printer 39, a magnetic cassette reader 40, a floppy disk reader 41, a hard disk reader 42, memory extension cards 43 with ROM and RAM circuits, a professional keyboard 44, a plotting table 45, interfaces 46 for sensors, process control, The applications of the hand-held computer according to the invention are extremely varied: bill-book/address-book, video-games, personal training, engineering, offices, terminals, process control. This computer is basically an editor, i.e. adapted for text processing. The term text covers here sets of alphanumeric characters, graphs, and sets of musical sounds. Then, the normal functions which are regrouped on the periphery of the touch-sensitive plate can for example be the controls relative to text-processing (locating, replacing, erasing, inserting, shifting, copying out, visualizing), to the elements of the text (characters, lines, paragraphs, page, memory bank, file), the controls relative to the movement of the text (START-UP/STOP, quicker/slower, 0,1) the displacement of the cursor ( ↑, ↓, →, ←, ↖ ).

The adaptation of the computer to particular uses is realized by plugging in specific electronical cards.

For example, the computer may be provided with a hand-writing recognition system such as the one proposed by the British company MICROPAD Ltd. Such a system makes it possible to identify a hand-written character or even signature which is drawn on the surface of a matrix of touch-sensitive areas by means of an object having a rounded tip or a finger.

The computer may also be associated with TV or radio receiving means, the list of emitters being displayed on the screen 21 for selection by the user by contacting the plate 22.

The invention is in no way limited to the description given hereinabove, but on the contrary covers any modification brought thereto without departing from the spirit and scope thereof.

What is claimed is:

1. A hand-held computer comprising:
   a casing including a peripheral frame, an upper wall and a lower wall;
   bus lines located inside said casing;
   a plurality of electronic circuit cards mounted inside said casing, arranged adjacent each other and removably connected to said bus lines for performing logical operations on input data;
   first and second sets of contacts formed in respective first and second electrical contact zones on an upper side of said peripheral frame and electrically connected to said bus lines;
   a flat display screen mounted on said peripheral frame for data output, said display screen having edge portions engaged with said first set of contacts on said upper side of the frame for electrical connection with said bus lines;
   a transparent plate including a matrix of touch-sensitive areas for data input and being mounted on said peripheral frame separate from said flat display screen, said transparent plate having edge portions engaged with said second set of contacts on said upper side of the frame for electrical connection with said bus lines, said transparent plate and said flat display screen being spaced apart from each other, being respectively arranged one above the other on said peripheral frame such that said transparent plate substantially forms said upper wall of said casing.

2. A hand-held computer according to claim 1, further comprising fastener means for urging edge portions of said flat display screen and said transparent plate onto said first and second contact zones, respectively, in order to electrically connect said flat display screen and said transparent plate to said bus lines.

3. A hand-held computer according to claim 1, further comprising connector means electrically connected to said bus lines and mounted outwardly on said peripheral frame for connecting external electrical devices to said bus lines.

4. A hand-held computer according to claim 1, wherein said bus lines are located internal to said peripheral frame and said electronic circuit cards are removably plugged into said peripheral frame for electrical contact with said bus lines.

5. A hand-held computer according to claim 1, further comprising a microphone connected to said electronic circuit cards for phoneme recognition.

* * * * *